(12) United States Patent
Guler et al.

(10) Patent No.: US 10,541,143 B2
(45) Date of Patent: Jan. 21, 2020

(54) SELF-ALIGNED BUILD-UP OF TOPOGRAPHIC FEATURES

(71) Applicant: Intel Corporation, Santa Clara, CA (US)

(72) Inventors: Leonard P. Guler, Hillsboro, OR (US); Nick Lindert, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/081,404

(22) PCT Filed: Mar. 30, 2016

(86) PCT No.: PCT/US2016/024911
§ 371 (c)(1),
(2) Date: Aug. 30, 2018

(87) PCT Pub. No.: WO2017/171751
PCT Pub. Date: Oct. 5, 2017

(65) Prior Publication Data
US 2019/0096685 A1 Mar. 28, 2019

(51) Int. Cl.
*H01L 21/308* (2006.01)
*H01L 21/02* (2006.01)
(Continued)

(52) U.S. Cl.
CPC .... *H01L 21/3085* (2013.01); *H01L 21/02123* (2013.01); *H01L 21/76885* (2013.01); *H01L 29/66545* (2013.01)

(58) Field of Classification Search
CPC .......................... H01L 21/3081; H01L 21/3083
(Continued)

(56) References Cited

U.S. PATENT DOCUMENTS 8,476,168 B2 * 7/2013 Graves-Abe ...... H01L 21/76898
257/E21.257
8,975,188 B2 * 3/2015 Hirayama ......... H01J 37/32082
438/702
(Continued)

FOREIGN PATENT DOCUMENTS

JP 2015536581 12/2015

OTHER PUBLICATIONS

International Preliminary Report on Patentability from PCT/US2016/024911 dated Oct. 11, 2018, 7 pgs.
(Continued)

*Primary Examiner* — Mark V Prenty
(74) *Attorney, Agent, or Firm* — Green, Howard & Mughal LLP

(57) ABSTRACT

Methods and architectures for self-aligned build-up of patterned features. An initial patterned feature aspect ratio may be maintained or increased, for example to mitigate erosion of the feature during one or more subtractive device fabrication processes. A patterned feature height may be increased without altering an effective spacing between adjacent features that may be further relied upon, for example to further pattern an underlying material. A patterned feature may be conformally capped with a material, such as a metal or dielectric, in a self-aligned manner, for example to form a functional device layer on an initial pattern having a suitable space width-to-line height aspect ratio without the use of a masked etch to define the cap.

20 Claims, 7 Drawing Sheets

(51) Int. Cl.
*H01L 21/768* (2006.01)
*H01L 29/66* (2006.01)

(58) Field of Classification Search
USPC .................................... 438/717, 736, 950
See application file for complete search history.

(56) References Cited

U.S. PATENT DOCUMENTS

| | | |
|---|---|---|
| 2008/0090348 A1 | 4/2008 | Chang et al. |
| 2012/0040534 A1 | 2/2012 | McGinnis et al. |
| 2014/0256106 A1 | 9/2014 | Khakifirooz et al. |
| 2015/0221676 A1 | 8/2015 | Holt et al. |

OTHER PUBLICATIONS

International Search Report and Written Opinion for PCT/US16/24911 dated Dec. 26, 2016, 10 pages.

* cited by examiner

SELF-ALIGNED BUILD-UP OF TOPOGRAPHIC FEATURES

CLAIM OF PRIORITY

This Application is a National Stage Entry of, and claims priority to, PCT Application No. PCT/US2016/024911, filed on 30 Mar. 2016 and titled "SELF-ALIGNED BUILD-UP OF TOPOGRAPHIC FEATURES", which is incorporated by reference in its entirety for all purposes.

BACKGROUND

Cell density in integrated circuits (ICs) continues to increase. Within the shrinking cell footprint, vertical feature orientations are becoming more important in the path toward monolithic 3D integration. Vertically oriented features often need to be tightly controlled to within some range of z-height, for example to achieve a particular performance metric or to ensure the feature aspect ratio provided to a downstream process is suitable.

Fabrication techniques are often subtractive, so to arrive at a final feature z-height one might pattern the feature with an initial height sufficient to account for subsequent erosion of the feature. However, such a strategy directly limits the feature density and minimum cell footprint. Regardless what feature aspect ratio (e.g., vertical height:lateral space) a given patterning process can achieve, the final product metrics will suffer if some of the height or feature pitch must be sacrificed as overhead associated with feature height erosion.

Topographic Feature architectures and techniques enabling more efficient utilization of their initially patterned aspect ratio may therefore be advantageous.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1:
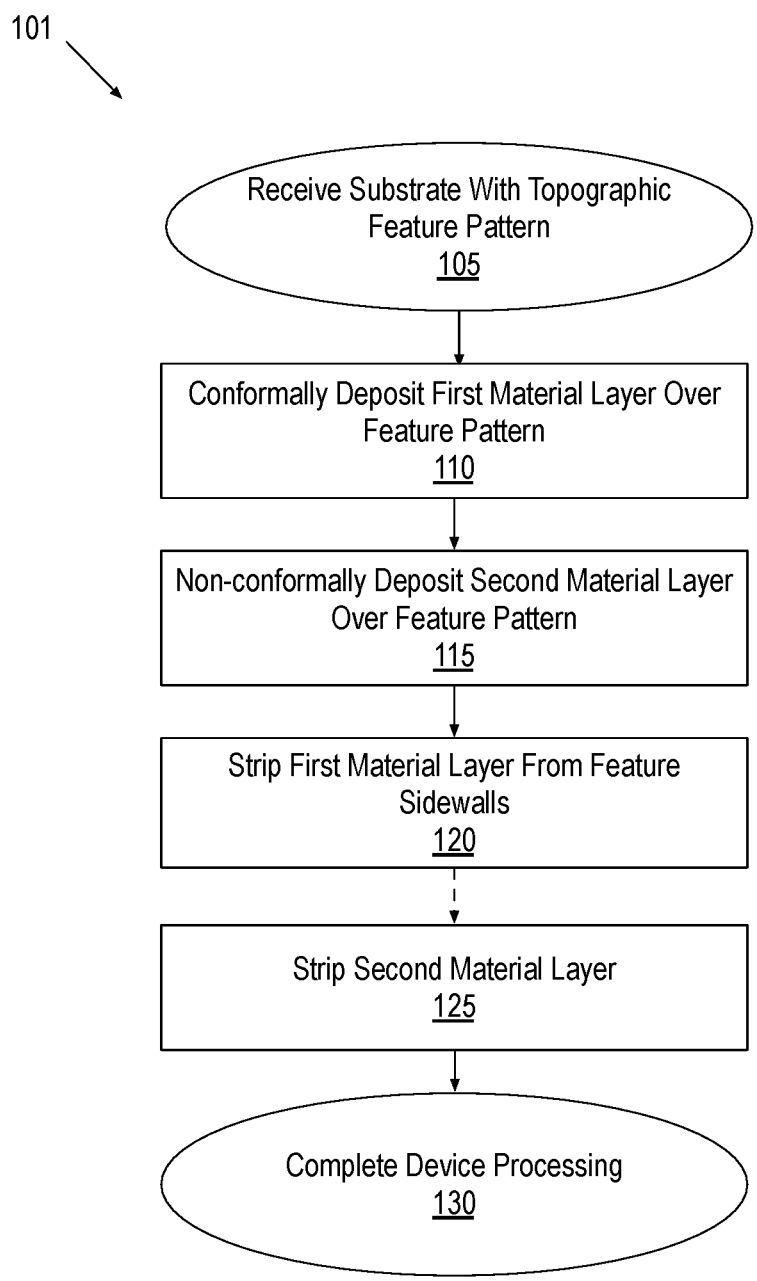
FIG. 1 is a flow diagram illustrating methods for self-aligned build-up of topographic features, in accordance with some embodiments.

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that embodiments may be practiced without these specific details. In some instances, well-known methods and devices are shown in block diagram form, rather than in detail, to avoid obscuring the embodiments. Reference throughout this specification to "an embodiment" or "one embodiment" or "some embodiments" means that a particular feature, structure, function, or characteristic described in connection with the embodiment is included in at least one embodiment. Thus, the appearances of the phrase "in an embodiment" or "in one embodiment" or "some embodiments" in various places throughout this specification are not necessarily referring to the same embodiment. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example in the context of materials, one material or material disposed over or under another may be directly in contact or may have one or more intervening materials. Moreover, one material disposed between two materials or materials may be directly in contact with the two layers or may have one or more intervening layers. In contrast, a first material or material "on" a second material or material is in direct contact with that second material/material. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Methods and architectures for self-aligned build-up of patterned features are described below. Some exemplary embodiments are described to illustrate use of the shadowing phenomena typical of a non-conformal deposition to form a variety of feature architectures. In some embodiments, an initial patterned feature aspect ratio is maintained or increased, for example to mitigate or negate erosion of the feature during one or more subtractive device fabrication processes. In some embodiments, a patterned feature height is increased without altering an effective spacing between adjacent features that may be further relied upon, for example to pattern an underlying material. As such, some embodiments described herein may be employed to improve the robustness of an etch mask or other sacrificial structure. In some embodiments, a patterned feature is capped with a material, such as a metal or dielectric, to form a functional device layer without the use of a masked etch to define the cap. In some embodiments, a grating of electrically insulated metal lines is formed based on an initial pattern having a suitable line height-to-space width aspect ratio. In some embodiments, a grating of magnetic tunneling junction (MTJ) films, or any film that may pose difficult to subsequently etch may be formed by techniques described herein. As such, some embodiments described herein may be employed to directly form permanent device structures. Although line-space gratings are illustrated as exemplary embodiments, the same technique may be applied to other topographic structures, such as a 2D grating of posts or pillars.

FIG. 1 is flow diagram illustrating methods 101 for aspect ratio based topography control, in accordance with some embodiments. Methods 101 begin at operation 105 where a substrate with a topographic feature pattern is received. The feature pattern includes at least a space between two adjacent sidewalls. This space may, for example, have a minimum lateral dimension (critical dimension, or "CD") that is the minimum resolvable space for a given patterning process. In some embodiments, the space is between to adjacent features, such as a pair of substantially parallel lines extending over the substrate.

Methods 101 continue at operation 110, where a first material layer is deposited over the feature pattern. In some advantageous embodiments, the first material layer is deposited with a conformal deposition process. Such a process is capable of depositing films with a very uniform thickness on all feature surfaces regardless of surface orientation relative to a plane defined by the substrate. One such process is atomic layer deposition (ALD), which is well-known for its sub-nanometer level thickness control and uniformity. In some exemplary embodiments where the feature pattern includes at least a space between two adjacent sidewalls, the first material layer is conformally deposited onto the sidewalls, as well as a bottom surface of the space. Following deposition of the first material layer on the sidewalls defining the space, the CD of the remaining space may be significantly reduced from the space CD as received at operation 105.

Methods 101 continue at operation 115, where a second material layer is deposited over the feature pattern. In some exemplary embodiments, the second material layer is of a different composition than the first material layer. In some further embodiments, the second material layer is deposited with a deposition process lacking the conformality of the process employed at operation 110. Advantageously, the deposition process employed at operation 115 is insufficiently conformal to deposit the second material layer over the entire surface of the sidewalls, and hence some portion of the first material layer near, or proximal, to a base of the features is shadowed from flux of the second material. Many directional deposition processes, such as physical vapor deposition (i.e., sputter deposition) are known to deposit material more rapidly on surfaces normal to ion flux (e.g., top of a feature) than on surfaces non-normal to the ion flux (e.g., sidewall of a feature). Any such process may be employed at operation 115.

Depending on the aspect ratio of the features, the deposition process employed at operation 115 may be more or less conformal. In some embodiments where the feature pattern includes at least a space between two adjacent sidewalls, if the sidewalls have a height that is only a few times greater than the space CD following the deposition of the first material layer, the deposition process employed at operation 115 may need to be highly non-conformal to ensure some portion of feature sidewalls are not covered with the second material. If, however, the sidewalls have a height that is, for example, 3-10 times greater than the space CD following the deposition of the first material layer, the deposition process employed at operation 115 may be less non-conformal and still achieve the desired structure. Following operation 115, the sidewall height of patterned features may be increased, for example by the difference in the thickness of the second material deposited on the top surface of the feature than in the bottom of the space. The lateral CD of a space between adjacent features at the top surface may also become smaller as a result of depositing the second material layer. In advantageous embodiments however, deposition operation 115 is terminated before any portion of the feature pattern is occluded, bridged, and/or "key-holed" by the second material. The key-holing phenomena is a well-characterized attribute of many non-conformal depositions, such as PVD.

Methods 101 continue at operation 120 where the first material layer is removed from at least a portion of the topographic feature sidewalls. Portions of the first material layer removed at operation 120 will be those not sufficiently protected by the second material layer deposited at operation 115. Following operation 115, at least the first material layer is retained on some portion of the feature pattern. Generally, because the first material layer is masked by the second material layer, the portion of the first material layer protected by the thickest portion of second material layer will be retained. In some advantageous embodiments, the first material layer is retained only near, or proximal, a top surface of the feature where the second material layer deposited most rapidly. The first material layer is removed near, or proximal, a bottom surface of a space between features where the second material was shadowed. For exemplary embodiments where the first and second material layers are of a different composition, operation 120 may employ an etch process that etches the first material selectively to (or faster than) the second material. With sufficient etch selectively, the second material may be retained through operation 120 in regions where the second material layer thickness was at some minimum. For embodiments where a non-selective etch is employed at operation 120, the second material may be completely removed at operation 120 and the first material layer retained only where the second material layer thickness was at some maximum. Notably, for an exemplary embodiment where the feature pattern includes at least a space between two adjacent sidewalls, after operation 120 the space (at least near the base of the features) has a CD that is substantially the same as that of the feature pattern received at operation 105. A height of the sidewalls however has necessarily increased from that of the feature pattern received at operation 105 because at least the first material layer has been retained near a top surface of the feature.

Methods 101 continue at operation 125, where the second material layer may be removed, if desired. Removal of the second material layer may advantageously maintain a CD (e.g., of the space near the top surface of the pattern features) more close to that of the feature pattern received at operation 105. Removal of the second material layer may also advantageously improve the effective uniformity of the topographic features since only the conformally deposited first material layer remains near the top surface of the features. Following operation 125, a top portion of the topographic features has been supplemented with a conformal first material layer. The features will therefore include a "cap" or "helmet" comprising the first material.

Methods 101 continue at operation 130, where device processing is completed, for example using any known techniques. Such techniques may further utilize the feature pattern built-up through operations 105-125. In some advantageous embodiments, the feature pattern is further employed as a mask for a subsequent etch process. For example, a substrate layer masked by the feature pattern may be etched in the presence of the feature pattern to translate the pattern into the substrate layer. Notably, because such an etch will be highly dependent on the CD of the space at the interface of the feature pattern and the substrate, the substrate etching may form a recess precisely aligned with the feature sidewalls as originally defined in the feature pattern. The cap or helmet comprising the first material layer (and potentially the second material layer) may impact the substrate etch only to the extent that the cap may improve robustness of the feature pattern to the substrate etch. For example, even where the cap is completely eroded by the substrate etch, the feature pattern can have substantially the same sidewall height as received at operation 105. Hence, erosion of the feature height may be countered and the topography maintained at a desired target.

In other embodiments, the cap including at least the first material may be retained throughout subsequent device processing. For example, where the cap is a metal, the metallized feature pattern may be employed in a final device, such as but not limited to a plurality of electrically independent word lines or bit lines of a memory cell, transistor gate electrodes and/or source/drain contacts, or interconnect metallization routing. As another example, where the first material layer a dielectric or magnetically polarizable material and the feature patterns include an electrode, the functionalized features may be employed in a final device, such as, but not limited to, an array of capacitor cells, spintronic (e.g., MTJ) cells, or the like.

Figure 2:
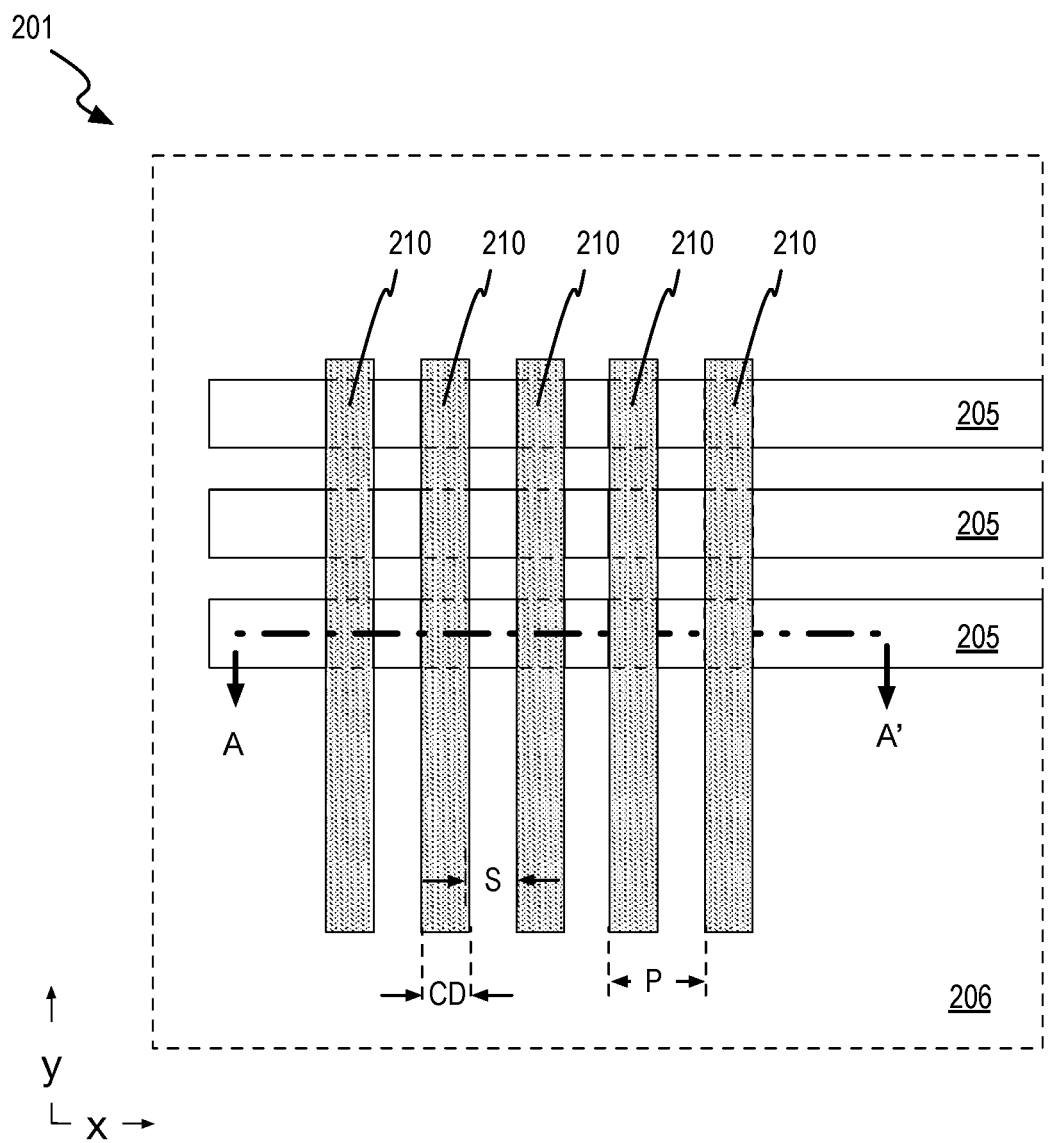
FIG. 2 is a plan view of a grating pattern, in accordance with some embodiments.

As noted above, the methods 101 may be applied to a variety of applications. To further illustrate various features and aspects of some embodiments, an etch mask application is further described below in the context of FIG. 2-8. FIG. 2 is a plan view of a line/space grating pattern, in accordance with some embodiments. In FIG. 2, solid lines denote salient materials forming a top reference surface of a transistor strata while dashed lines denote salient materials that are disposed below another overlying material. Heavy dot-dashed lines denote planes along which cross-sectional views are further provided as FIG. 3-8 after selected operations from the methods 101 are performed on the grating pattern, in accordance with some embodiments.

Referring to FIG. 2, a grating pattern 201 includes lines 210 separated by intervening spaces of width S. Lines 210 are disposed over a substrate layer 205. Lines 210 have a transverse width CD (e.g., x-dimension) and a pitch P that is further dependent on the transverse width of substrate layer 205 exposed within spaces between lines 210. Lines 210 may have any longitudinal length (e.g., y-dimension). Dimensions of grating pattern 201 may vary as a function of patterning capability, and as described further below, feature aspect ratio is more significant than lateral dimension. In some exemplary embodiments, CD varies from 5-50 nm while P varies from 10-100 nm. Hence, adjacent lines 210 may be spaced apart 5-50 nm in some embodiments.

For embodiments herein, the architecture of substrate layer 205 may vary without limitation. Substrate layer 205 may be any material layer disposed over any carrier 206 known to be suitable for supporting thin film fabrication. As one example, substrate layer 205 may be a dielectric material layer, semiconductor material layer, or, conductive material layer (e.g., metal layer). As a further example, substrate layer 205 may be one or more semiconductor materials from which transistor channels are to be fabricated. For such embodiments, substrate layer 205 may be any semiconductor composition known to be suitable for a transistor (e.g., a FET), such as, but not limited to, group IV materials (e.g., Si, Ge, SiGe), group III-V materials (e.g., GaAs, InGaAs, InAs, InP), or group III-N materials (e.g., GaN, AlGaN, InGaN). In some advantageous embodiments, substrate layer 205 is monocrystalline. Substrate layer 205 may also be polycrystalline, for example where substrate layer 205 is a deposited thin film semiconductor material. In some embodiments, substrate layer 205 has been previously patterned into one or more features that lines 210 are disposed over. For such embodiments, substrate layer 205 may comprise non-planar semiconductor bodies (e.g., fins), metal stripes, dielectric stripes, or the like. Substrate layer 205 may be disposed over a carrier 206 such as one or more materials (e.g., a crystalline semiconductor) upon which substrate layer 205 was grown or deposited upon, or to which substrate layer 205 was transferred before or after grating pattern 201 was fabricated. For example, the carrier may be a transistor strata in a monolithically stacked device, a polymer sheet, or any other substrate non-native to substrate layer 205.

Figure 3:
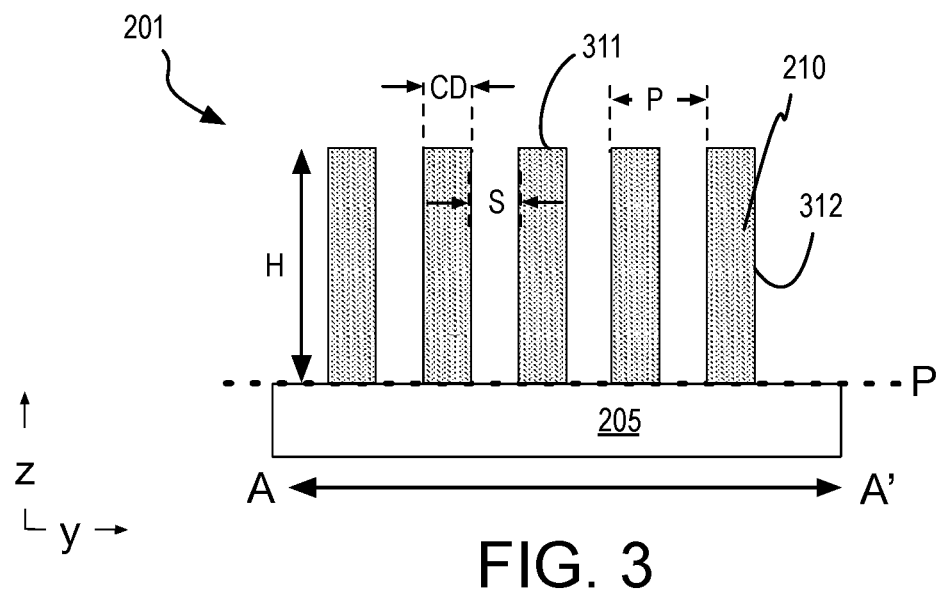
FIGS. 3, 4, 5, 6, 7, and 8 illustrate cross-sectional views of the grating pattern shown in FIG. 2 after selected operations from the method illustrated in FIG. 1 are performed, in accordance with some embodiments.

FIG. 3 further illustrates a cross-sectional view of grating pattern 201 along the A-A' line that was denoted in FIG. 2. As shown, each line 210 includes a sidewall 312 having a sidewall height H extending between a base of line 210 interfacing substrate layer 205 at the plane P, and a top surface 311. Although illustrated with an ideally vertical sidewall 312 with infinite smoothness, it is appreciated that actual sidewalls may have non-orthogonal slope and a finite roughness characteristic of a given patterning process. Line sidewall height H may vary as a function of line width CD and pitch P within a range where the feature aspect ratio (H:S) is sufficiently high to ensure a subsequent non-conformal deposition process is adequately shadowed. In some exemplary embodiments where CD is 5-50 nm, S is 5-10 nm, and P is 10-100 nm, H is 50-200 nm for an H:S aspect ratio of 3-10. Grating feature 201 may have a line height-to-line space aspect ratio over 10, however.

In the illustrated embodiment, lines 210 are of a single homogenous material, such as any dielectric, semiconducting, or conductive material known in the nanofabrication arts. Exemplary materials include silicon dioxide, silicon nitride, silicon oxynitride, low-k dielectrics (e.g., relatively permittivity below 4.0), high-k dielectrics (e.g., relative permittivity over 9.0), polycrystalline and amorphous Si, SiGe, Ge, carbonaceous materials (e.g., diamond-like carbon), elemental metals, metal alloys, metal nitrides, carbides, and the like. In other embodiments, lines 210 comprise a vertical stack of multiple material layers having different compositions. Each layer in such a stack may again be any dielectric, semiconducting, or conductive material known in the nanofabrication arts. In other embodiments, lines 210 comprise a lateral stack of multiple material layers having different compositions. Such a stack may for example comprise a first material having a height approximately equal to H with a second material, also extending the height H and forming sidewall 312 (e.g., a gate electrode surrounded by a dielectric spacer). Each layer in such a stack may again be any dielectric, semiconducting, or conductive material known in the nanofabrication arts.

Figure 4:
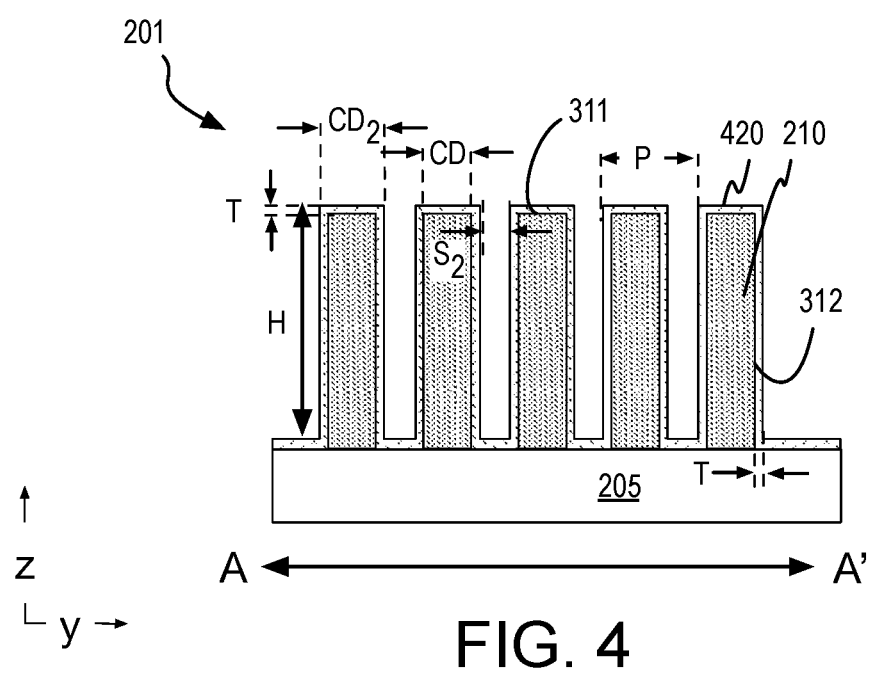

FIG. 4 is a cross-sectional view of grating 201 along the A-A' line following deposition of a first material layer 420. Material layer 420 may be conformally deposited or otherwise formed in a conformal manner, for example at operation 110 (FIG. 1). As illustrated, material layer 420 has a thickness T that is substantially the same (e.g., <5% different) on both line sidewall 312 and top surface 311. Following formation of material layer 420, lines 210 remain with a sidewall height H, but the transverse line width increases by approximately twice sidewall thickness T to $CD_2$. The space between adjacent lines 210 likewise decreases to $S_2$, which is smaller than S by approximately twice the sidewall thickness T. The first material may be deposited to any thickness as limited by the spacing between adjacent lines such that the first material does not fill or occlude any lines in grating pattern 201. In some exemplary embodiments, material layer 420 is deposited to a thickness T of 1-10 nm (e.g., T<5 nm where S<10 nm). Following deposition of material layer 420, the line height:line space aspect ratio will have increased from that of the initial grating pattern.

Material layer 420 may have any known composition. For example, material layer 420 may include a dielectric film, semiconductor film, or conductive film. Although a single material layer is illustrated, a multi-layered stack is also possible. In some embodiments, the composition of material layer 420 is the same as that of one or more materials of line 210, effectively enlarging the lines and altering the line: space portions of pitch P. In some advantageous embodiments, material layer 420 has a different composition than one or more materials of line 210. In some such embodiments, material layer 420 is a material that can be selectively removed (etched) from line 210. In some further embodiments, material layer 420 is a material that offers greater resistance to a subsequent etch process than one or more materials of line 210.

Material layer 420 may be deposited with any process known to be suitable for isotropically and/or conformally depositing materials on a grating pattern having a particular aspect ratio. In some embodiments, material layer 420 is deposited with an ALD process. For example, material layer 420 may comprises a metal associated with a metalorganic precursor of an ALD process. In one exemplary embodiment, material layer 420 comprises Al, either as a conductive film or as a dielectric film (e.g., $Al_2O_3$). In another exemplary embodiment, material layer 420 comprises some other metal oxide, such as $HfO_2$, or a metal silicate, such as $HfSiO_x$, or $TaSiO_x$. In some other embodiments, material layer 420 is deposited with a CVD process. For example, material layer 420 may comprise a dielectric, such as silicon nitride, silicon oxynitride, or silicon dioxide. In some other embodiments where line 210 comprises a semiconductor, such as Si, SiGe, Ge, GaAs, or the like, material layer 420 may be epitaxially grown with any epitaxy process known to provide suitably conformal crystal growth over a grating pattern. In still other embodiments, material layer 420 is formed through a conversion of a portion of line 210, for example by thermal or plasma oxidation and/or nitridation.

Figure 5:
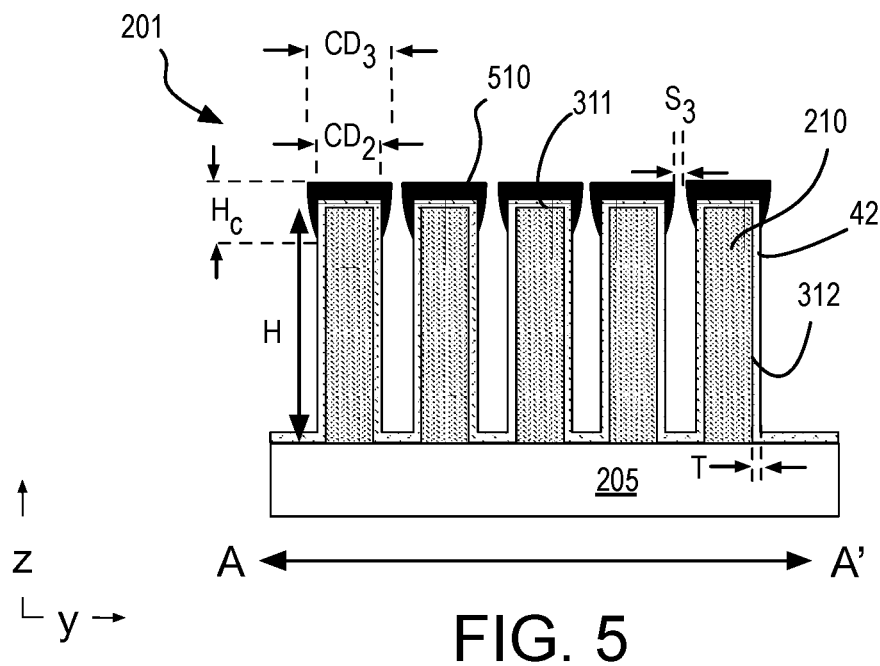

FIG. 5 is a cross-sectional view of grating 201 along the A-A' line following deposition of a second material layer 510. Material layer 510 may be anisotropically or non-conformally deposited, or otherwise formed, for example at operation 115 (FIG. 1). As shown in FIG. 5, material layer 510 is formed primarily over top line surface 311, covering only an upper portion of sidewall 312 equal to cap height $H_c$. Following deposition of material layer 510, the line height: line space aspect ratio has increased further from that of the initial grating pattern. No material layer 510 forms on the remainder of sidewall 312 (e.g., $H-H_c$) as a result of aspect ratio shadowing during the non-conformal deposition operation. Because some sidewall deposition may occur within the cap height $H_c$, the transverse width of line 210 may increase from $CD_2$ to $CD_3$, reducing the line space at top surface 311 to a minimum cap space $S_3$. In advantageous embodiments, material layer 510 is deposited to a thickness limited to maintain a non-zero cap space $S_3$. Cap space $S_3$ is advantageously greater than nil to avoid occluding or forming keyholes between lines 210. In some exemplary embodiments, material layer 510 is deposited to a thickness of 1-10 nm (e.g., <5 nm where S<10 nm) over line top surface 311. The top portion of sidewall 312 over which at least some material layer 510 is formed will vary as a function of the shape of top surface 311 and slope of sidewall 312. For example, $H_c$ may only be a few nanometers where the line has a planar top and the transition between top surface 311 and sidewall 312 is abrupt, as illustrated in FIG. 5. Likewise, if sidewall 312 has a negative slope (e.g., undercutting top surface 311), shadowing is enhanced and $H_c$ may be only a few nanometers. Rounded top surfaces and/or positively sloped sidewalls may result in cap height $H_c$ being a significant portion of sidewall height H.

Material layer 510 may have any known composition. For example, material layer 510 may include a dielectric film, semiconductor film, or conductive film. Although a single material layer is illustrated, a multi-layered stack is also possible. In some embodiments, the composition of material layer 510 is the same as that of one or more materials of line 210 and/or material layer 420. In some advantageous embodiments, material layer 510 has a different composition than material layer 420. In some such embodiments, material layer 510 is a material from which material layer 420 can be selectively removed (etched), and vice versa. In some further embodiments, material layer 510 is a material that can be selectively removed (etched) from line 210. For example, material layer 510 may be of chemical compound that is resistant to an etchant of material layer 420 and susceptible to etching by an etchant that has little effect on material of line 210.

Material layer 510 may be deposited with any process known to be suitable for anisotropically and/or non-conformally depositing material layer 510 on a grating pattern of a particular aspect ratio. In some embodiments, a directional deposition process is employed, such as, but not limited to, PVD. A sputter target may be formed of virtually any material, but some materials may be more suitable than others to achieve compositional differentiation with other materials of the grating. For example, where material layer 420 or line 210 comprises an oxide, material layer 510 may comprises a non-oxide (e.g., a semiconductor, metal, nitrogen-doped metal, carbon-doped metal, or metal carbonitride) deposited by reactive sputter or co-sputter techniques. In one exemplary embodiment, material layer 510 comprises Si. In anther exemplary embodiment, material layer 510 comprises TiN, TaN, TaN. In still other embodiments, material layer 510 comprises one or more of Co, Pt, Ru, CoFeB.

Figure 6:
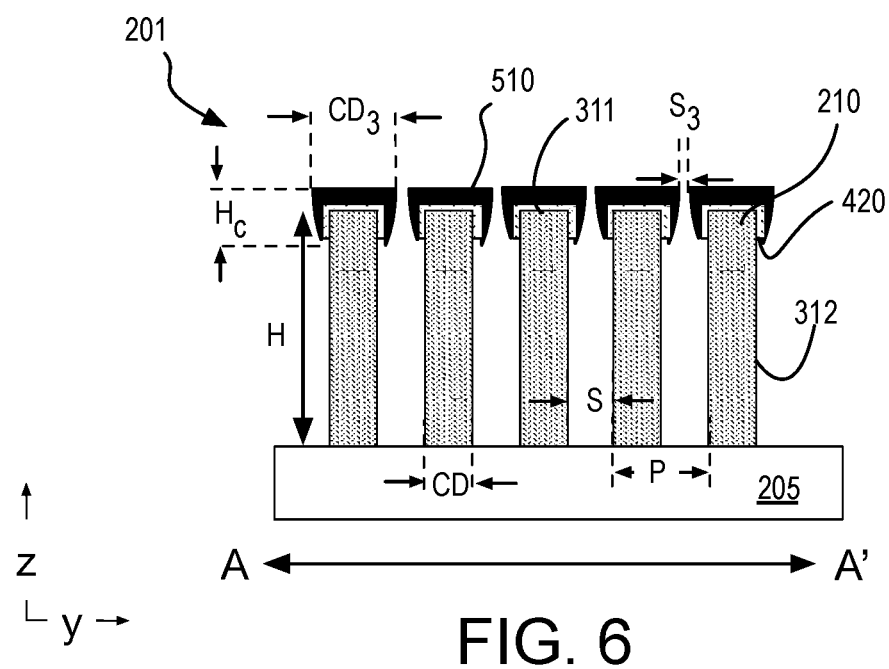

FIG. 6 is a cross-sectional view of grating 201 along the A-A' line following removal of portions of material layer 420 not protected by material layer 510. In advantageous embodiments where grating pattern 201 is not occluded by material layer 510, etchant species have access to material layer 420 within spaces of all lines 210. Material layer 420 may then be selectively etched, or otherwise removed for example at operation 120 (FIG. 1). As shown in FIG. 6, material layer 420 is removed from sidewall 312 except for an upper portion of sidewall 312 equal to cap height $H_c$ where material layer 510 provides a protective mask. Material layer 420 is also removed from a bottom surface between adjacent lines 210, exposing substrate layer 205 at the base of lines 210.

In some advantageous embodiments, material layer 420 is etched selectively to line 210. In some further embodiments represented by FIG. 6, material layer 420 is etched selectively to line 210 and selectively to material layer 510. In some embodiments, material layer 420 is etched isotropically with wet chemical etchant or a dry (e.g., plasma) etch process. Etchant chemistry and techniques may be any known in the art to be suitable for the purpose given the composition of material layer 420. For example, where material layer 420 comprises $Al_2O_3$, any of phosphoric acid, ammonia hydroxide, TMAH, or nitric acid solutions may be employed to remove exposed regions of material layer 420.

Following removal of exposed portions of material layer 420, material layer 510 may then be removed selectively to the remaining portions of material layer 420. Alternatively, material layer 510 may be retained on lines 210 as a multi-layered cap. Retention of material layer 510 may advantageously add additional height to lines 210 and further robustness as an etch mask. Removal of material layer 510 may advantageously minimize the cap thickness, cap thickness variation, and most nearly approximate the transvers width and pitch to which the grating was originally patterned (e.g., at both the top and bottom of lines 210). Notably, even where material layer 510 is retained, the bottom line width and pitch at the interface of substrate layer 205 may be substantially as originally patterned (e.g., a transverse width equal to CD, bottom space equal to S) even though the width of the cap has increased to $CD_3$.

Figure 7:
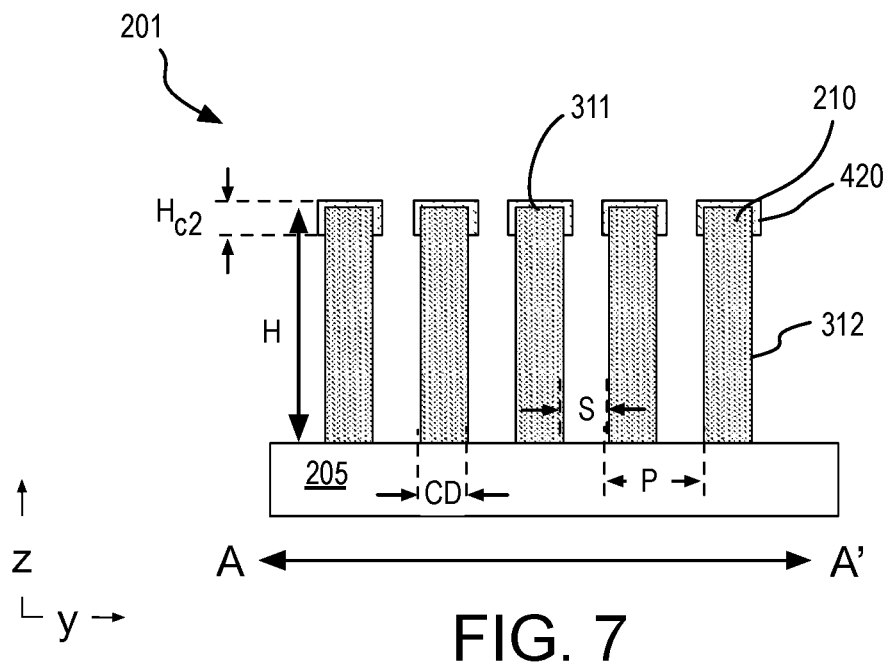

FIG. 7 is a cross-sectional view of grating 201 along the A-A' line following removal of material layer 510. In some embodiments, the capped topographic features may be retained in a final device structure substantially as illustrated, and/or employed as sacrificial structures. As shown, grating 201 now comprises lines 210 of a base material having first line and space widths with cap material 420 disposed over the base material and wrapping around a top portion of the base material to define a second line width, larger than the first line width, and a second space width, smaller than the first space width.

Material layer 510 may be selectively etched, or otherwise removed, for example at operation 125 (FIG. 1). In some exemplary embodiments, material layer 510 is removed selectively to both material layer 420 and line 210, leaving a cap of material layer 420 extending over top line surface 311. The cap of material layer 420 may also wrap around a small portion of sidewall 312, for example by an amount $H_{c2}$, giving the cap a shape akin to a helmet. In some advantageous embodiments, material layer 510 is etched selectively to line 210 and remaining portions of material layer 420. For example, material layer 510 may be etched isotropically with wet chemical etchant or a dry (e.g., plasma) etch process. Etchant chemistry and technique may be any that are known in the art to be suitable for the purpose given the composition of material layer 510. For example, where material layer 510 comprises Si, one or more of phosphoric acid, potassium hydroxide, or TMAH solutions may be employed to remove material layer 510, further depending on the composition of line 210 and material layer 420.

Figure 8:
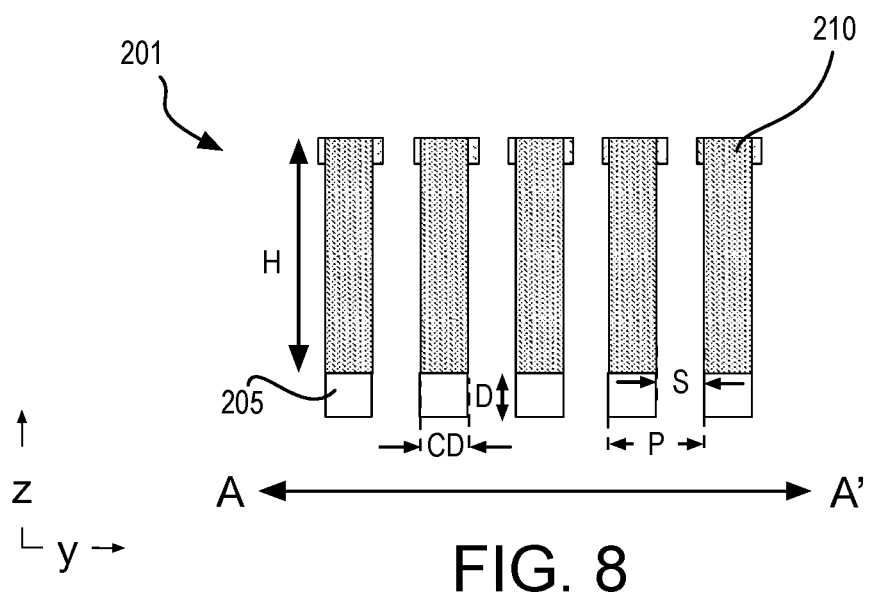

Following removal of sidewall portions of material layer 420 (and potentially also material layer 510), the grating pattern may comprise lines having substantially the same transverse width and pitch (at least at the interface of a substrate) as originally patterned. In some embodiments, the capped grating pattern may then be employed as an enhanced mask to translate the grating pattern into one or more underlying substrate layers, for example at operation 130 (FIG. 1). FIG. 8 is a cross-sectional view of a conformally capped grating 201 along the A-A' line following an etch of substrate layer 205. Substrate layer 205 may be etched anisotropic ally to have sidewalls etched to a height D that are aligned with line sidewalls 312. Sidewall height D may be 5-50 nm, for example. Any etch process known to be suitable for etching substrate layer 205 may be utilized to remove portions of substrate layer 205 not protected by grating pattern 201. In one example where substrate layer 205 is a semiconductor layer (or patterned semiconductor fin), the semiconductor may be completely etched through to bifurcate the layer (fin) into smaller lengths substantially equal to the transverse width CD. As shown in FIG. 8, the conformal caps of material layer 420 are substantially consumed by the substrate layer etch. As such, lines 210 have nearly the same topographic characteristics as they had upon initial patterning. Although material layer 420 is substantially consumed in the illustrated example, in other embodiments at least some thickness of material layer 420 may be retained on top surface 311.

Following the etch of substrate layer 205, fabrication of lines 210 and/or surrounding substrate layer 205 may proceed according to any techniques known to be applicable for a given device. For example, if a transistor is to be fabricated from the patterned substrate layer 205, any known transistor fabrication process can be performed on the patterned substrate layer 205. Such processing may, but need not, further employ lines 210 in the transistor fabrication process. For example, lines 210 may serve as sacrificial mandrels that are eventually removed, or may become permanent device structures. In either situation, topographic feature erosion associated with the subtractive substrate etch process is mitigated even to the extent of negating the effect of the processing on exposed topographic features.

In view of the above description, it will be appreciated that the technique of self-alignedly forming a conformal cap on topographic features having suitable aspect ratio may be readily applied one or more times in a fabrication process to combat feature erosion and/or to form discrete caps of any material conformally deposited on over the feature.

Figure 9:
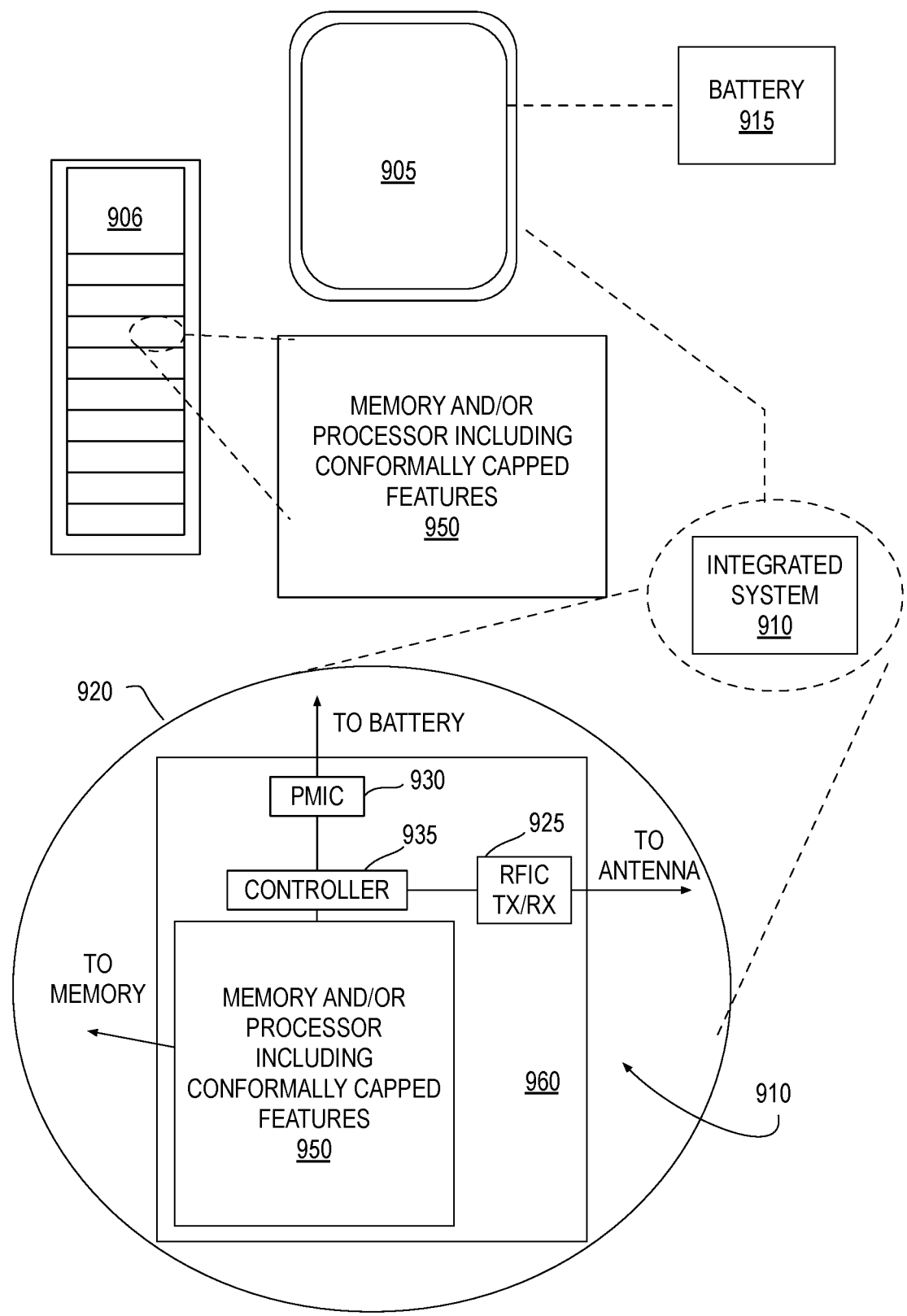
FIG. 9 illustrates a mobile computing platform and a data server machine employing an SoC including conformally capped topographic features, in accordance with embodiments.

FIG. 9 illustrates a mobile computing platform and a data server machine employing an SoC including a conformally capped topographic feature, for example a conformally capped grating comprising an array of capped topographic features. The server machine 906 may be any commercial server, for example including any number of high-performance computing platforms disposed within a rack and networked together for electronic data processing, which in the exemplary embodiment includes a packaged monolithic SoC 950. The mobile computing platform 905 may be any portable device configured for each of electronic data display, electronic data processing, wireless electronic data transmission, or the like. For example, the mobile computing platform 905 may be any of a tablet, a smart phone, laptop computer, etc., and may include a display screen (e.g., a capacitive, inductive, resistive, or optical touchscreen), a chip-level or package-level integrated system 910, and a battery 915.

Either disposed within the integrated system 910 illustrated in the expanded view 920, or as a stand-alone packaged chip within the server machine 906, monolithic SoC 950 includes a memory block (e.g., RAM), a processor block (e.g., a microprocessor, a multi-core microprocessor, graphics processor, or the like) including at least one conformally capped topographic feature, for example a conformally capped grating comprising an array of capped topographic features. The monolithic SoC 950 may be further coupled to a board, a substrate, or an interposer 960 along with, one or more of a power management integrated circuit (PMIC) 930, RF (wireless) integrated circuit (RFIC) 925 including a wideband RF (wireless) transmitter and/or receiver (TX/RX) (e.g., including a digital baseband and an analog front end module further comprises a power amplifier on a transmit path and a low noise amplifier on a receive path), and a controller 935.

Functionally, PMIC 930 may perform battery power regulation, DC-to-DC conversion, etc., and so has an input coupled to battery 915 and with an output providing a current supply to other functional modules. As further illustrated, in the exemplary embodiment, RFIC 925 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 4G, and beyond. In alternative implementations, each of these board-level modules may be integrated onto separate ICs or integrated into monolithic SoC 950.

Figure 10:
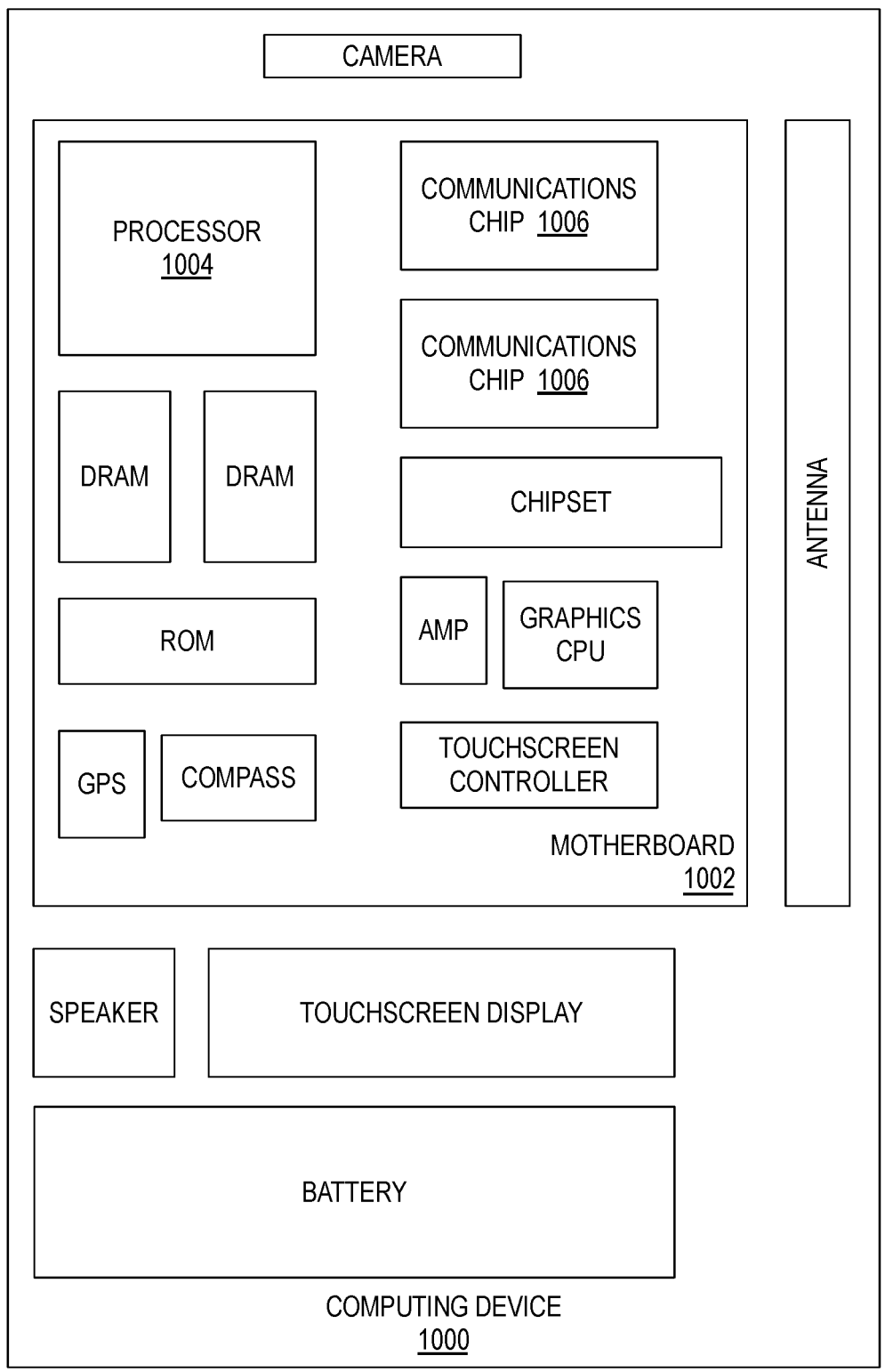
FIG. 10 is a functional block diagram of an electronic computing device, in accordance with some embodiments.

FIG. 10 is a functional block diagram of an electronic computing device, in accordance with some embodiments. Computing device 1000 may be found inside platform 1005 or server machine 1006, for example. Device 1000 further includes a motherboard 1002 hosting a number of components, such as, but not limited to, a processor 1004 (e.g., an applications processor), which may further incorporate at least one conformally capped topographic feature, for example a conformally capped grating comprising an array of capped topographic features. Processor 1004 may be physically and/or electrically coupled to motherboard 1002. In some examples, processor 1004 includes an integrated circuit die packaged within the processor 1004. In general, the term "processor" or "microprocessor" may refer to any device or portion of a device that processes electronic data from registers and/or memory to transform that electronic data into other electronic data that may be further stored in registers and/or memory.

In various examples, one or more communication chips 1006 may also be physically and/or electrically coupled to the motherboard 1002. In further implementations, communication chips 1006 may be part of processor 1004. Depending on its applications, computing device 1000 may include other components that may or may not be physically and electrically coupled to motherboard 1002. These other components include, but are not limited to, volatile memory (e.g., DRAM), non-volatile memory (e.g., ROM), flash memory, a graphics processor, a digital signal processor, a crypto processor, a chipset, an antenna, touchscreen display, touchscreen controller, battery, audio codec, video codec, power amplifier, global positioning system (GPS) device, compass, accelerometer, gyroscope, speaker, camera, and mass storage device (such as hard disk drive, solid-state drive (SSD), compact disk (CD), digital versatile disk (DVD), and so forth), or the like.

Communication chips 1006 may enable wireless communications for the transfer of data to and from the computing device 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 1006 may implement any of a number of wireless standards or protocols, including but not limited to those described elsewhere herein. As discussed, computing device 1000 may include a plurality of communication chips 1006. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that principles of the disclosure are not limited to the embodiments so described, but can be practiced with modification and alteration without departing from the scope of the appended claims. For example the above embodiments may include specific combinations of features as further provided below.

In one or more first embodiments, a nanofabrication method comprises patterning a pair of features having sidewalls that define a space there between, depositing a first material layer over a top surface of the features and over the sidewalls, depositing a second material layer over the first material layer, wherein deposition of the second material is insufficiently conformal to form the second material layer over all portions of the first material layer covering the sidewalls, and exposing at least a portion of the sidewalls by removing regions of the first material layer unprotected by the second material layer while retaining the first material layer over the top surface of the features.

In furtherance of the first embodiments, depositing the first material layer further comprises a conformal CVD or ALD deposition process, and depositing the second material layer further comprises a non-conformal PVD deposition process.

In furtherance of the first embodiments immediately above, the non-conformal PVD deposition further comprises depositing the second material over the top surface at a first rate exceeding a second rate at which the second material is deposited more proximal to a base of the feature.

In furtherance of the first embodiments, depositing the first material layer further comprises depositing a material comprising Al with an ALD process.

In furtherance of the first embodiments, depositing the second material layer comprises sputter depositing at least one of silicon, a metal, or a nitride thereof.

In furtherance of the first embodiments, removing regions of the first material layer unprotected by the second material layer further comprises isotropically etching the first material layer selectively to the second material layer.

In furtherance of the first embodiments, the method further comprises etching an exposed portion of a substrate disposed within the space, the substrate etching consuming at least a portion of the first material layer from the top surface of the features.

In furtherance of the first embodiments immediately above, etching the substrate consumes all of the first material layer.

In furtherance of the first embodiments, the method further comprises etching the second material layer selectively to the first material layer after removing the regions of the first material layer unprotected by the second material layer.

In furtherance of the first embodiments, the patterning defines the pair of features to have a first line space-to-line height aspect ratio equal to a ratio of a first lateral width of the space at a base of the feature to a first height of the sidewalls. Depositing the first material layer reduces the lateral width of the space to a second lateral width. Removing the regions of the first material layer increases the second lateral width of the space back to the first lateral width of the space while increasing the first sidewall height by at least a thickness of the first material layer.

In one or more second embodiments, a method of fabricating a transistor comprises patterning a pair of features to have adjacent sidewalls defining a space within which a semiconductor fin is exposed, depositing a first material layer over a top surface of the features and over the adjacent sidewalls, depositing a second material layer over the first material layer, wherein the adjacent sidewalls are of sufficient height to shadow at least the space from deposition of the second material, removing regions of the first material layer unprotected by the second material layer while retaining the first material layer over at least the top surface, and etching the space into the fin in alignment with the adjacent sidewalls, the features protected from at least a portion of the fin etching by at least the first material layer.

In furtherance of the second embodiments, the first material layer is deposited with a more conformal process than is the second material layer.

In furtherance of the second embodiments, depositing the first material layer further comprises a conformal CVD or ALD deposition process. Depositing the second material layer further comprises a non-conformal PVD deposition process. Removing regions of the first material layer comprises isotropically etching the first material layer selectively to the second material layer. Etching the space into the fin further comprises anisotropically etching the fin exposed between the adjacent sidewalls of the features.

In furtherance of the second embodiments immediately above, depositing the first material layer further comprises depositing a material comprising Al with an ALD process. Depositing the second material layer comprises sputter depositing at least one of silicon, a metal, or a nitride thereof.

In furtherance of the second embodiments, the method further includes removing the second material layer while retaining a portion of the first material layer disposed over the top surface.

In furtherance of the second embodiments, removing the second material layer further comprises an isotropic etch with an etchant having selectivity to pair of features.

In furtherance of the second embodiments, the space is less than 10 nm, the sidewalls have a height at least three times that of the space, the first material layer is deposited to a thickness of 1-5 nm, and the second material layer is deposited to a thickness of 1-5 nm.

In one or more third embodiments, a semiconductor device, comprises a plurality of recesses in a substrate material forming a grating pattern having first line and space widths and a plurality of topographic features disposed over the substrate material. The topographic features further comprise a base material having the grating pattern with the first line and space widths, and a cap material is disposed over the base material and wrapping around a top portion of the base material to define a second line width, larger than the first line width, and a second space width, smaller than the first space width.

In furtherance of the third embodiments, the cap material is conformal, having the same thickness on a top surface of the features as on a sidewall of the features within the top portion.

In furtherance of the third embodiments, the space is less than 10 nm, the sidewalls have a height above the substrate material that is at least three times that of the space, the first material layer is deposited to a thickness of 1-5 nm, and the second material layer is deposited to a thickness of 1-5 nm.

However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. A nanofabrication method, comprising:
   patterning a pair of features having sidewalls that define a space therebetween;
   depositing a first material layer over a top surface of the features and over the sidewalls;
   depositing a second material layer over the first material layer, wherein deposition of the second material is insufficiently conformal to form the second material layer over all portions of the first material layer adjacent to the sidewalls; and
   exposing at least a portion of the sidewalls by removing regions of the first material layer unprotected by the second material layer while retaining the first material layer over the top surface of the features.

2. The method of claim 1, wherein:
   depositing the first material layer further comprises a conformal CVD or ALD deposition process; and depositing the second material layer further comprises a non-conformal PVD deposition process.

3. The method of claim 2, wherein the non-conformal PVD deposition further comprises depositing the second material over the top surface at a first rate exceeding a second rate at which the second material is deposited more proximal to a base of the feature.

4. The method of claim 2, wherein depositing the first material layer further comprises depositing a material comprising Al with an ALD process.

5. The method of claim 2, wherein depositing the second material layer comprises sputter depositing at least one of silicon, a metal, or a nitride thereof.

6. The method of claim 1, wherein removing regions of the first material layer unprotected by the second material layer further comprises isotropically etching the first material layer selectively to the second material layer.

7. The method of claim 1, wherein the method further comprises etching an exposed portion of a substrate disposed within the space, the substrate etching consuming at least a portion of the first material layer from the top surface of the features.

8. The method of claim 7, wherein etching the substrate consumes all of the first material layer.

9. The method of claim 1, wherein the method further comprises etching the second material layer selectively to the first material layer after removing the regions of the first material layer unprotected by the second material layer.

10. The method of claim 1, wherein:
the patterning defines the pair of features to have a first line space-to-line height aspect ratio equal to a ratio of a first lateral width of the space at a base of the feature to a first height of the sidewalls;
depositing the first material layer reduces the lateral width of the space to a second lateral width; and
removing the regions of the first material layer increases the second lateral width of the space back to the first lateral width of the space while increasing the first sidewall height by at least a thickness of the first material layer.

11. A method of fabricating a transistor, comprising:
patterning a pair of features to have adjacent sidewalls defining a space within which a semiconductor fin is exposed;
depositing a first material layer over a top surface of the features and over the adjacent sidewalls;
depositing a second material layer over the first material layer, wherein the adjacent sidewalls are of sufficient height to shadow at least a portion of the space from deposition of the second material;
removing regions of the first material layer unprotected by the second material layer while retaining the first material layer over at least the top surface; and
transferring the space by etching into the fin in alignment with the adjacent sidewalls, the features protected from at least a portion of the etching by at least the first material layer.

12. The method of claim 11, wherein the first material layer is deposited with a more conformal process than is the second material layer.

13. The method of claim 11, wherein:
depositing the first material layer further comprises a conformal CVD or ALD deposition process;
depositing the second material layer further comprises a non-conformal PVD deposition process;
removing regions of the first material layer comprises isotropically etching the first material layer selectively to the second material layer; and
transferring the space into the fin further comprises anisotropically etching the fin exposed between the adjacent sidewalls of the features.

14. The method of claim 13, wherein:
depositing the first material layer further comprises depositing a material comprising Al with an ALD process; and
depositing the second material layer comprises sputter depositing at least one of silicon, a metal, or a nitride thereof.

15. The method of claim 11, further comprising:
removing the second material layer while retaining a portion of the first material layer disposed over the top surface.

16. The method of claim 15, wherein removing the second material layer further comprises an isotropic etch with an etchant having selectivity to pair of features.

17. The method of claim 11, wherein:
the space is less than 10 nm;
the sidewalls have a height at least three times that of the space;
the first material layer is deposited to a thickness of 1-5 nm; and
the second material layer is deposited to a thickness of 1-5 nm.

18. A semiconductor device, comprising:
a plurality of recesses in a substrate material forming a grating pattern having first line and space widths; and
a plurality of topographic features over the substrate material, the topographic features further comprising:
a base material having the grating pattern with the first line and space widths; and
a cap material over the base material and wrapping around a top portion of the base material to define a second line width, larger than the first line width, and a second space width, smaller than the first space width.

19. The device of claim 18, wherein the cap material is conformal, having a first thickness on a top surface of the features that is substantially the same as a second thickness of the cap material on a sidewall of the features within the top portion.

20. The device of claim 19, wherein:
the first space width is less than 10 nm;
the sidewalls have a height above the substrate material that is at least three times that of the first space width;
the first thickness is 1-5 nm; and
the second thickness is 1-5 nm.

* * * * *